United States Patent [19]
Borras et al.

[11] Patent Number: 5,175,729
[45] Date of Patent: Dec. 29, 1992

[54] RADIO WITH FAST LOCK PHASE-LOCKED LOOP

[75] Inventors: Jaime A. Borras, Hialeah; Armando J. Gonzalez, Miami; Cesar W. Carralero, Hialeah, all of Fla.

[73] Assignee: Motorola, Inc., Schaumburg, Ill.

[21] Appl. No.: 710,637

[22] Filed: Jun. 5, 1991

[51] Int. Cl.⁵ .......................... H04B 1/40; H03L 7/00
[52] U.S. Cl. ..................... 370/79; 455/260; 375/81
[58] Field of Search ............. 370/77, 79, 50, 123; 331/17, 14; 455/76, 260; 375/81, 82

[56] References Cited
U.S. PATENT DOCUMENTS

| | | | |
|---|---|---|---|
| 3,993,958 | 11/1976 | Cutsogeorge | 331/17 |
| 4,117,420 | 9/1978 | DeConinck | 331/17 |
| 4,167,711 | 9/1979 | Smoot | 331/17 |
| 4,243,941 | 1/1981 | Zdunek | 329/50 |
| 4,330,758 | 5/1982 | Swisher et al. | 331/17 |
| 4,559,505 | 12/1985 | Suarez et al. | 331/17 |
| 4,703,520 | 10/1987 | Rozanski, Jr. et al. | 455/76 |
| 4,866,710 | 9/1989 | Schaeffer | 370/50 |

Primary Examiner—Douglas W. Olms
Assistant Examiner—Min Jung
Attorney, Agent, or Firm—M. Mansour Ghomeshi

[57] ABSTRACT

A communication device (508) for use in a Time Division Multiplex (TDM) communication system (500) includes a transmitter, a receiver, and a frequency scanner for quickly scanning the radio frequency communication channels to determine an available channel. The communication device (508) also includes a phase locked loop (100) for providing a reference signal for the communication device (508) and locking to the available channel. This phase locked loop (100) includes a Voltage Control Oscillator (VCO) (104) having a control signal input (103). The phase locked loop (100) also includes a first filter (110) and a second filter (108). The first filter (110) has a wide frequency response. The second filter (108) includes a storage element (222) and has a narrow frequency response. The phase locked loop (100) also includes a switching circuit (106) which determines which one of the two filters (110, 108) gets coupled to the voltage control oscillator (104).

9 Claims, 4 Drawing Sheets

RADIO WITH FAST LOCK PHASE-LOCKED LOOP

TECHNICAL FIELD

This invention relates generally to communication devices and particularly to communication devices having fast acquisition phase locked loops.

BACKGROUND

Radios with Phase Locked Loops (PLL) are known in the art. Generally, PLL's have a VCO and a loop filter which is used to remove noise components form the control signal of the VCO. The loop filter is switchable between the first state having a wide passband for realizing a large noise bandwidth of the phase locked loop so that a large capture range and a rapid acquisition is obtained and a second state having a narrow passband for realizing a small noise bandwidth of the loop in order that the influence on the oscillator output signal of noise and phase jitter in the offered frequency spectrum can be reduced. An example is shown in the book "Phase Locked Techniques", by F. M. Gardner, John Wiley and Sons, Inc., 1966, page 53.

In time division multiplex (TDM) communication systems where a high speed receiver and transmitter is needed to scan and communicate on the available channels, a loop filter such as one described above may not meet system requirements. The problem arises from the fact that the narrow band filter is not fast enough to locked to the channels as they are being scan. Therefore, a major sacrifice in scan time must be made in order to successfully scan a number of channels. U.S. Pat. No. 4,117,420, DeConinck et al., discloses a PLL having a VCO and an adaptive filter coupled to the control line of the VCO. The loop filter includes two resistors in series with a storage element to allow switching between two states. The switching of the two states occurs at the instant at which the instantaneous value of the signal stored in the loop filter capacitor is equal to the average value of the control signal of the VCO. Furthermore, the switchability is provided via two resistors in series with the storage element. The timing and the method of switching between the two states of the filter renders the output signal of the VCO significantly susceptible to transients. These transients can not be tolerated in fast switching TDM systems. It is therefore clear that a need exists for a radio with a PLL that can successfully and quickly scan a number of channels with minimum transients and without sacrificing stability, noise immunity, and transmission time.

SUMMARY OF THE INVENTION

A radio for use in a Time Division Multiplex (TDM) communication system is provided. The radio includes a transmitter means, a receiver means, and a scanning means for quickly scanning the radio frequency communication channel to determine an available channel. The radio also includes a phase locked loop for providing a reference signal for the radio and locking to the available channel. This phase locked loop includes a voltage control oscillator (VCO) having a control signal input. The phase locked loop also includes a first filter and a second filter. The first filter has an output and a wide frequency response. The second filter includes a storage element and has a narrow frequency response. The phase locked loop also includes a switching circuit which determines which one of the two filters gets coupled to the voltage control oscillator.

DESCRIPTION OF THE PREFERRED EMBODIMENT

Figure 5:
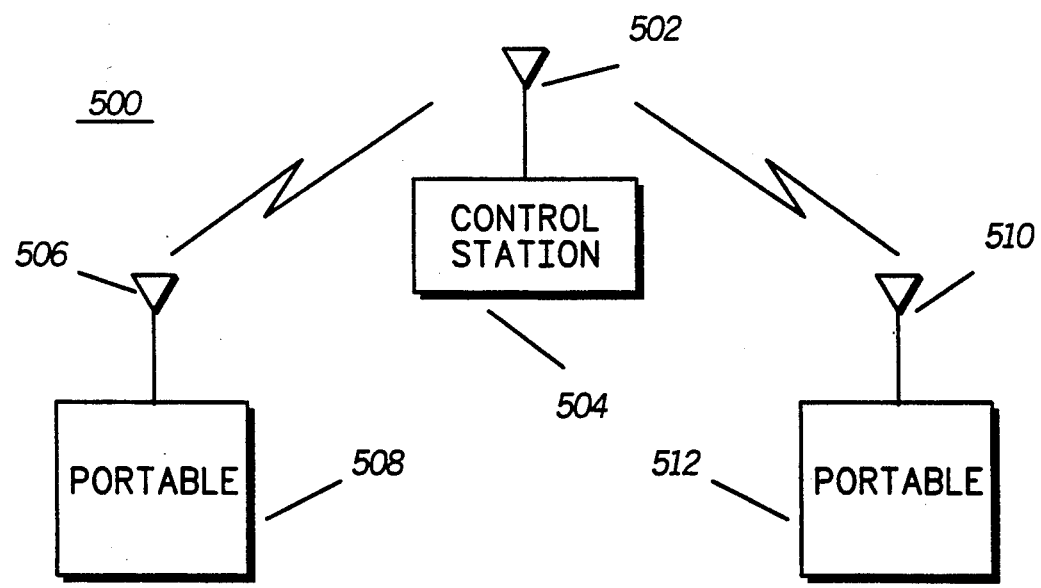
FIG. 5 is a TDM communication system in accordance with the present invention.

Referring first to FIG. 5 a block diagram of a Time Division Multiplexed (TDM) communication system 500 is shown in accordance with the present invention. The communication system 500 includes a control station 504 with its associate antenna 502. The communication system 500 also includes a plurality of radios transceivers as shown by two portable radios 508 and 512 having associated antennas 506 and 510, respectively. The communication between the two portable radios 508 and 512 is conducted via the control station 504. The control station 504 also provides communication between the portable radios 508 and 512 to units of other systems including but not limited to telephone systems. Other types of transceivers such as mobile radios are suitable for this system and may be used. The portables 508 provides the communication device of the present invention.

Figure 1:
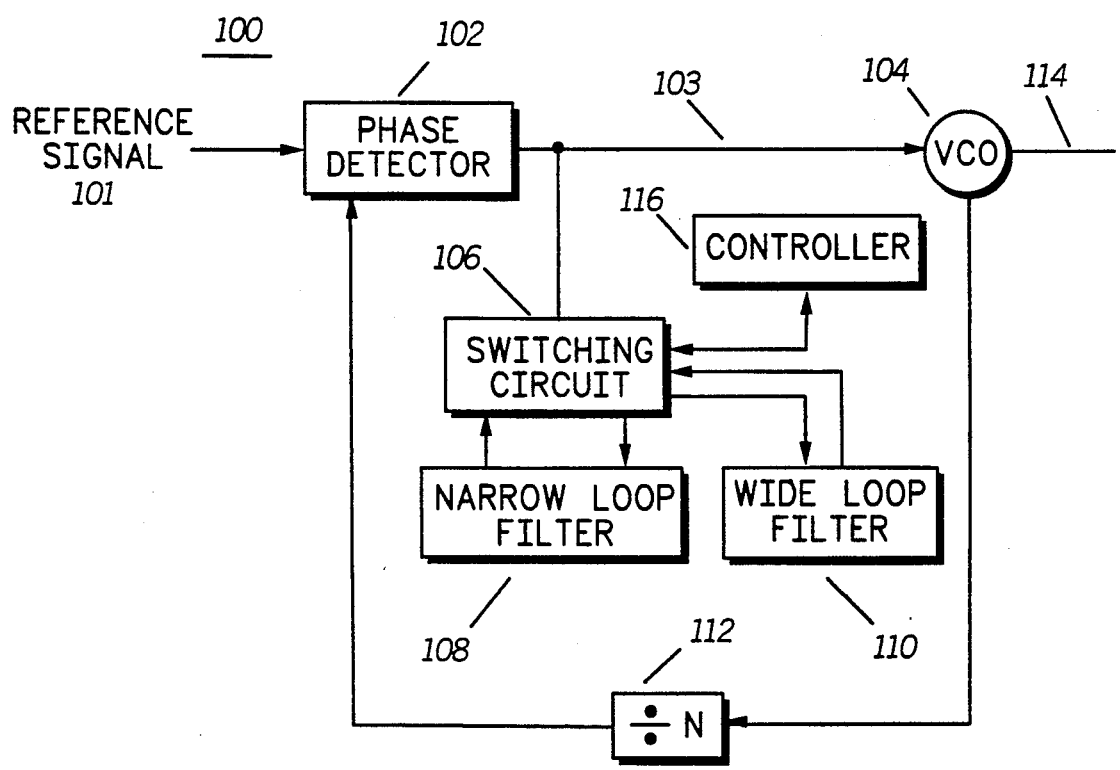
FIG. 1 is a block diagram of a phase locked loop in accordance with the principles of the present invention.

Referring now to FIG. 1, a block diagram of a Phase Locked Loop (PLL) 100 is shown in accordance with the present invention. Although it is preferable to use a PLL with this invention, a frequency lock loop may be used to meet the objectives of the present invention. The PLL 100 is shown to include a phase detector 102 having its first input connected to a reference signal 101. The reference signal 101 is a free running stable oscillator. The second input of the phase detector 102 is a feed back signal from the output of the PLL circuit 100. The origin of this feed back signal will be evident as more of the components of the PLL 100 are explained. The output of the phase detector 102 is coupled to the control input of a Voltage Controlled Oscillator (VCO) 104. The output of the switching circuit 106 is coupled to the control input line 103. The switching circuit 106 includes gates that are used to couple or decouple a wide loop filter 110 and a narrow loop filter 108 from the control input line 103. The wide loop filter 110 and the narrow loop filter 108 constitute the first and the second filters of the present invention, respectively. The switching of the gates within the switching circuit 106 are controlled by a controller 116. The controller 116 is used by other elements of the communication device 508 which includes the PLL 100. A sample of the output of the VCO 104 is fed back into the phase detector 102 via its second input after being divided by N via a divide by N block 112. The output of the VCO 104 is an output signal 114 which is coupled to appropriated circuits in the communication device 508 as will be discussed later.

The phase detector 102 detects the phase differential between the reference signal input 101 and a sample of the VCO output available at the output of the divide by N block 112. This phase differential is converted to a control signal which is then placed on the control input line 103 and applied to the VCO 104. This control signal steers the VCO 104 to the appropriate frequency. This control signal is laden with loop noise which must be filtered for the VCO 104 to run at a stable frequency. The two filters 110 and 108 are utilized to provide this needed filtering. At initial start up, a special loop filter is needed for fast acquisition. The wide loop filter 110 provides this performance. The drawback of the wide loop filter 110 is its wide bandpass response. With the wide bandpass, undesired noise riding on the control input line 103 is allowed to pass to the VCO 104 causing interference and poor transmission quality. As will be explained later, this interference can be tolerated in some modes of operation. However, in other modes of operation where a higher degree of performance accuracy is required, a narrower filter must be used. The narrow loop filter 108 provides the desired frequency response. This desired frequency response is however associated with a long acquisition time. The narrow loop filter 108 is rendered ineffective in fast systems such as the TDM system 500 under discussion here.

To alleviate this problem, the switching circuit 106, under the control of the controller 116, pre-charges the storage elements of the narrow loop filter 108 while having the wide loop filter 110 coupled to the control line 103. With the pre-charging, the narrow loop filter 108 is ready when it is time for it to be coupled. This pre-charging results in a significant reduction in the effective acquisition time of the narrow loop filter 108. The significance of the effective short acquisition time of the narrow loop filter 108 will become more evident as the operation of the communication device containing the PLL 100 is presented. In the transmit mode the command to switch over from the wide loop filter 110 to the narrow loop filter 108 is originated after an available channel has been located. In the receive mode however, the command is originated after the proper digital code has been received with the wide loop filter 110 engaged.

Figure 2:
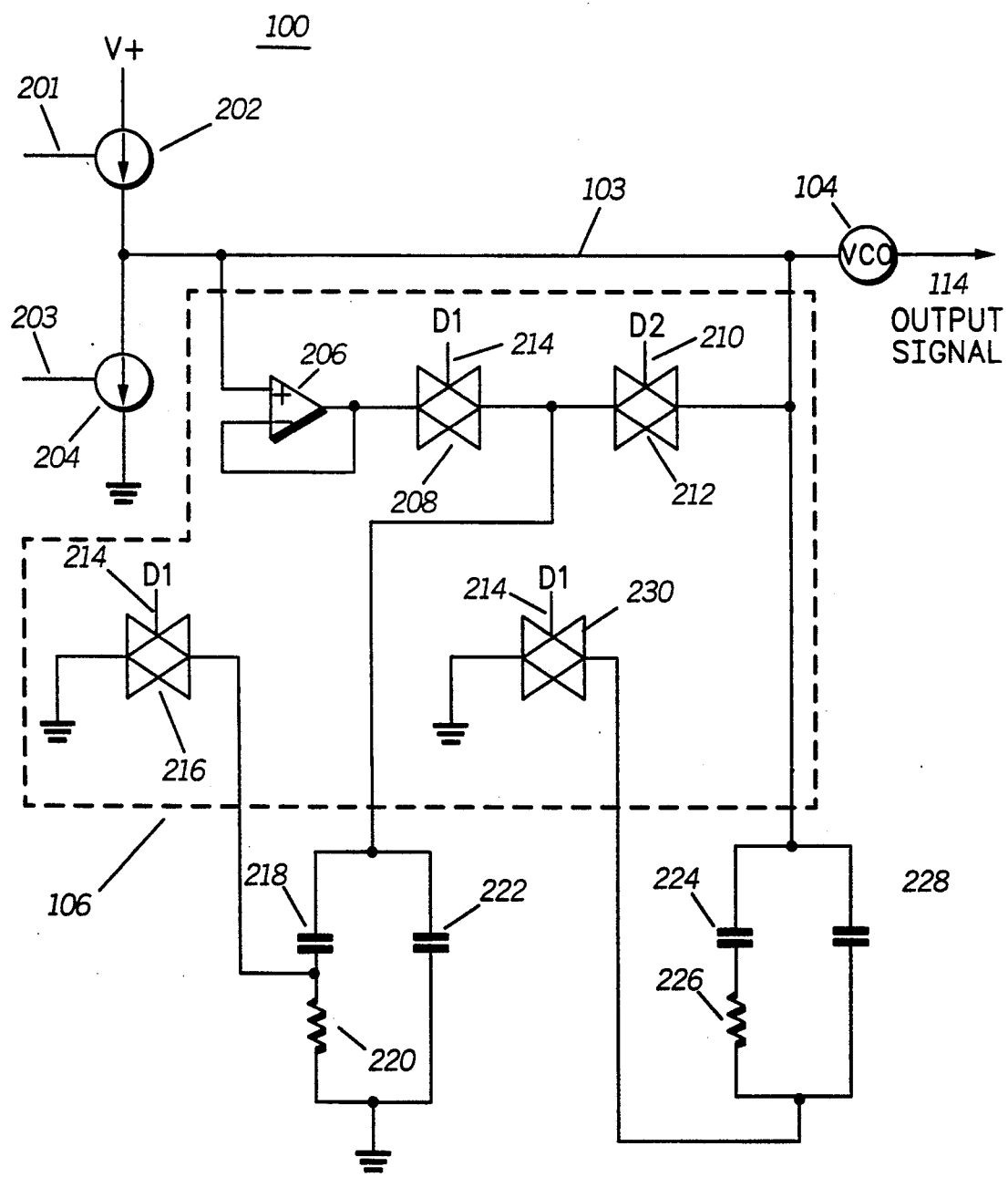
FIG. 2 is a schematic diagram of a portion of a phase locked loop of FIG. 1 as is pertinent to the present invention.

Referring to FIG. 2, a schematic diagram of a portion of the phase locked loop 100 is shown in accordance with the principles of the present invention. Included in this diagram are the elements of the two filters 110 and 108, the switching circuit 106, portions of the phase detector 102, and the VCO 104. To avoid unnecessary complications, the elements of the divider 112, the controller 116, and most of the elements of the phase detector 102 have not been included in FIG. 2. Two control signals 201 and 203 from the phase detector 102 are coupled to two current sources; sourcing device 202 and sinking device 204. As part of its operation, the sourcing device 202 supplies current to the switching circuit 106 to pre-charge the storage elements of the narrow loop filter 108. The elements of the switching circuit 106 include a buffer 206 whose non-inverting input is coupled to the junction of the sourcing device 202 and sinking device 204. The output of the buffer 206 is coupled to an analog gate 208 whose control signal is D1 214. The analog gate 208 is used to charge capacitors 218 and 222 which are the storage elements of the narrow loop filter 108. A resistor 220 is also included in the narrow loop filter 108. Coupled to the junction of the resistor 220 is the output of an analog gate 216 whose control signal is D1 214 and whose input is coupled to ground. The output of the analog gate 208 is connected to a third analog gate 212 whose control signal is D2 210. The control signals D1 and D2 are signals provided to their respective analog gates from the controller 116. The output of the analog gate 212 is coupled to the control input line 103 and also to the elements of the wide loop filter 110. These elements include a capacitor 228 in parallel with a combination of a capacitor 224 and a resistor 226. Collectively, they are connected to the input of an analog gate 230 whose output is coupled to ground and whose control signal is D1 214. The characteristics of capacitors 228 and 224 and the resistor 226 are such that they provide the wide loop filter 110 with the desired wide band pass characteristics for fast frequency acquisition performance.

When the phase locked loop 100 is commanded, by the controller 116, to lock to a particular frequency, the control signals D1 214 and D2 210 are high and low respectively. With the control signal D1 214 high, the three analog gates, 208, 216, 230 are in the ON state. The analog gate 208 couples the output of the buffer 206 to the two capacitors 222 and 218. At this time, the capacitors 222 and 218 begin to be pre-charged via the buffer 206. With the analog gate 216 in the ON position, the resistor 220 is removed from the ground path of the capacitor 218 thereby providing lower impedance path for the charging current that charges the capacitor 218. Since the analog gate 212 is in the OFF position, the narrow loop filter 108 is decoupled from the control line 103. Instead, with the analog gate 230 in the ON state, the wide loop filter 110 is coupled to the control line 103. With the wide loop filter 110 in the path of the control input line 103, certain components of noise are eliminated. After a certain amount of time, determined by the characteristics of the phase locked loop 100 or by the communication signal received, the control signal D1 214 and D2 210 change states. The controller 116 commands the control lines D1 214 and D2 210 to change to the low and high state respectively. This results in the analog gates 208, 216, and 230 switching OFF and the analog gate 212 switching ON. The OFF state of the analog gate 208 disconnects the capacitors 218 and 222 from the pre-charging buffer 206. The OFF state of the analog gate 216 removes the ground from the junction of the capacitor 218 and the resistor 220 so as to allow the two components to function as a filter. The OFF state of the analog gate 230 decouples ground from the wide loop filter 110 rendering it floating. On the other hand, the ON state of the analog gate 212 couples the narrow loop filter 108 to the control input line 103 of the VCO 104. With the narrow loop filter 108 in the circuit, more components of the noise riding on the control input line 103 are eliminated.

To summarize, the phase locked loop 100 is shown using two filters; the wide loop filter 110 and the narrow loop filter 108. The use of these two filters take advantage of their respective characteristics to achieve the high acquisition and low noise requirements of the phase locked loop 100. While the wide loop filter 110 is engaged, the storage elements of the narrow loop filter 108 are being charged to the precise control voltage via the buffer 206 and the analog gate 208. The pre-charging of the filter 108 effectively reduces its acquisition time. When the charging is complete, which is indicated by the control voltage at the output of the narrow loop filter 108 being substantially equal to that of the output of the wide loop filter 110, the wide loop filter 110 is operatively removed and replaced by the narrow loop filter 108 so as to provide the VCO control signal 103 with a narrow filter. This scheme of switching the two filters 108 and 110 eliminates switching transients in the way that the filters 108 and 110 are coupled. The timing with which the control signals D1 214 and D2 210 are switched ON and OFF is significant to the operation of the phase locked loop 100. This timing has to be carefully calculated, since it is intended for the PLL 100 to lock to a desired frequency in the shortest amount of time possible. The switching of the two wide loop and narrow loop filters 110 and 108 is significant for it allows fast lock time without sacrificing loop performance.

Figure 3:
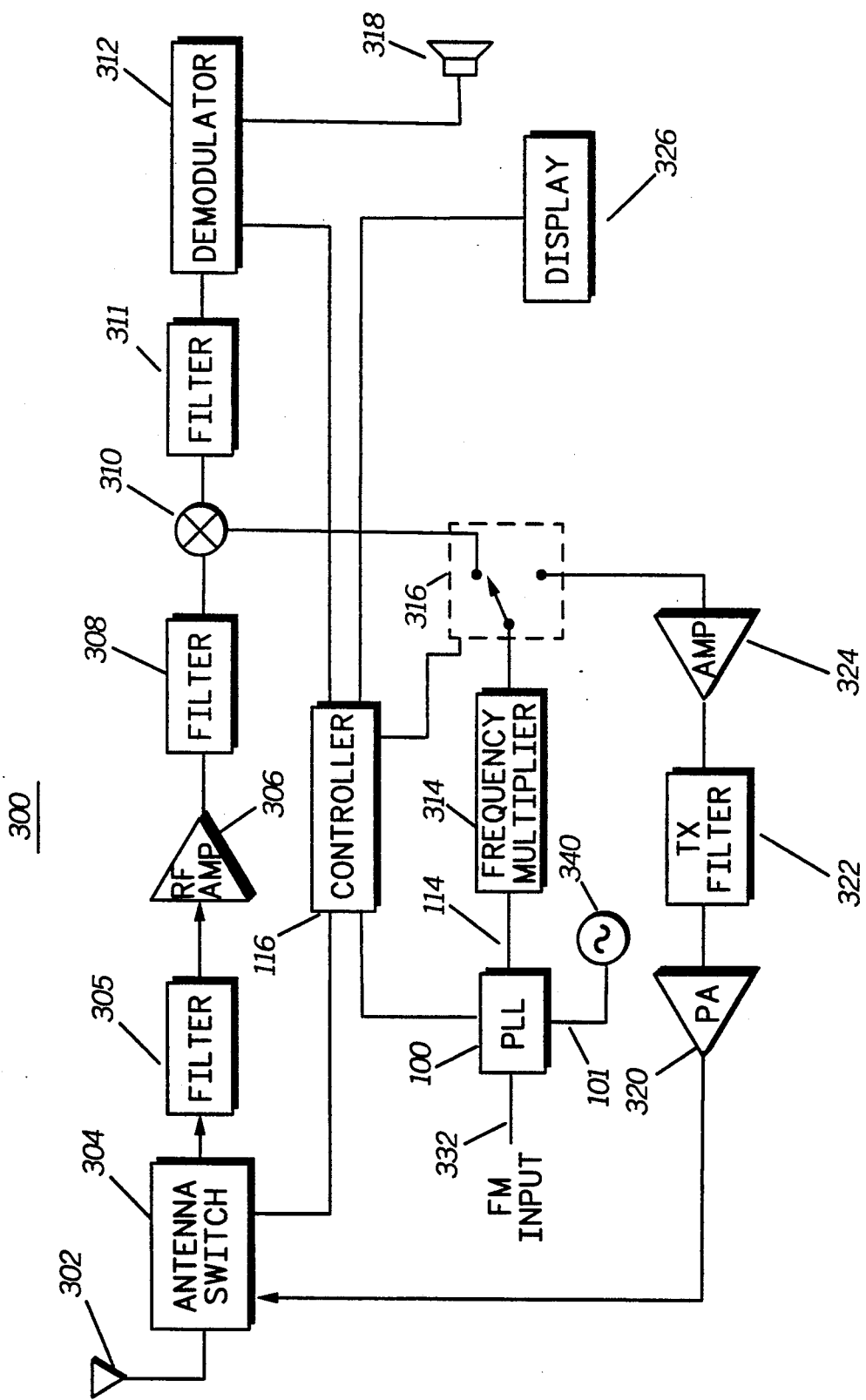
FIG. 3 is a block diagram of a radio communication device.

Referring to FIG. 3, a communication device 508 is shown in accordance with the present invention. The communication device 508 includes a transmitter and a receiver along with other elements providing it with scanning and PLL means for quick transmit acquisition. The transmitter and receiver of the communication device 508 share some of the blocks shown in FIG. 3. To avoid complications, the operation of the elements of the communication device 508 will be described in conjunction with each other wherever possible. An antenna 302 is used to receive and transmit radio frequency signals. The antenna 302 is coupled to an antenna switch 304. The antenna switch 304 switches between the transmitter section and the receiver section of the communication device 508 under the direction of the controller 116.

In the receive mode, a radio frequency signal, preferably digitally modulated, is received by the antenna 302 and coupled to an RF amplifier 306 via the antenna switch 304 and a preselector filter 305. The amplified RF signal is the filtered by a filter 308 and applied to the first input of a mixer 310. The second input of the mixer 310 is coupled to the first output of a switch 316. The input pole of the switch 316 is coupled to the output of a frequency multiplier 314 whose input is the output of the PLL 100. At this point the wide loop filter 110 is engaged in the PLL 100. This is made possible by the inherent greater noise immunity that is offered by digital modulation systems. Generally, digital transmission has the significant ability to operate in relatively high levels of random noise, hence wider loop bandwidths can be tolerated for decoding a received signal.

Consequently, the second input of the mixer 310 receives the signal 114 multiplied by the frequency multiplier 314. The output of the mixer 310 is coupled to a TDM demodulator block 312 through a filter 311 where it is demodulated. The demodulated signal is then communicated to the controller 116. The controller 116 determines whether the received signal is one intended for the communication device 508. In the event that it is, the controller 116 commands the switching circuit 106 to decouple the wide loop filter 110 and replace it with the narrow loop filter 108. Once again this switching is accomplished with the storage elements 218 and 222 of the narrow loop filter 108 being fully charged to the required voltage of the control signal 103. The switch over from one filter 110 to another 108 takes place with minimum associated noise due to the expected charge condition of the capacitors 218 and 222. The buffer 206 is an operation amplifier very with low offset voltage. The low offset voltage of the buffer 206 forces its output voltage to very closely follow its input voltage which is the control signal 103 with the wide loop filter 110 engaged. The analog gates 208, 212, 216, and 230 have very low ON impedance which is essential in charging the capacitors 218 and 222 to the exact voltage of the control signal 103. The selection of these components provides for a substantially smooth switch over from one filter 110 to another 108 which is essential to the proper operation of the PLL 100.

The controller 116 decodes the contents of the demodulated signal to determine its appropriate destination. Voice messages are coupled through to the speaker 318 via the TDM demodulator 312. Data messages are coupled to the display 326 via the controller 116. The operation of the various blocks of the communication device 508 is well known in the art. In order to minimize unnecessary complications, the detailed description of the operation of these blocks is avoided unless it is necessary to the operation of the elements of the present invention. The TDM demodulator 312 may include a second conversion circuit to further reduce the frequency of the incoming signal. Also included in the TDM demodulator 312 are digital demodulators, coders, decoders, and circuits to demodulate the IF signal which is at the output of the mixer 310. The frequency multiplier 314 is used to increase the frequency output of the phase locked loop 100 to match the frequency of the received signal for the purposes of the mixer 310. The reference signal 101 of the PLL 100 is provided via an oscillator 340. The controller 116 provide the scanning means of the receiver of the communication device 508.

In the transmit mode, the switch 316 switches to the transmit pole and the antenna switch 304 switches to the transmit mode. An information signal applied to the FM input 332 of the PLL modulates the output of the VCO 104 as is known in the art. The output signal 114 of the PLL 100 is applied to the frequency multiplier 314. At 314 the frequency of the VCO output signal 114 is increased to meet the frequency of operation of the communication device 508. This multiplied signal is then coupled to an amplifier 324 via the switch 316. The amplified signal is then filtered by a transmitter filter 322 and amplified by a power amplifier 320 before it is applied to the antenna switch 304. The antenna switch 304 couples the amplified transmitter signal to the antenna 302 for transmission. The controller 116 is coupled to the antenna switch 304 and the switch 316. The operation of both these switches and several other elements of the communication device 508 such as; the display 326 and the demodulator 312 are controlled by the controller 116.

Referring once again to FIG. 5, when a request for transmission is made by the user of the communication device 508, the receiver attempts to scan all of the available channels a number of times to determine which channel is available for communication. In the preferred embodiment, the communication system 500 includes 40 channels and the receiver and the transmitter operate on the same frequency. The receiver therefore, scans the 40 channels a number of times, specifically 5 times and each time it determines two available channels. The available channels are selected based on their signal strength. The receiver of the communication device 508 picks up the two channels with the lowest signal strengths. This is repeated five times. The channels with the lowest signal strength are then checked by the controller 116 to determine which one remained at low signal strength for the duration of the scan. That one channel is then selected by the controller 116 for use by the communication device 508 for transmission. It is this rapid scanning mode of operation of the communication device 508 that requires the phase locked loop 100 to have a dual filter scheme which can provide fast acquisition and low noise immunity for transmission. Scanning the number of channels, particularly 40, a number of times, in this case 5, requires the phase locked loop that can lock to a channel at a very high speed. The phase locked loop 100 as demonstrated in FIG. 1 is able to provide a communication device 508 with this high speed requirement.

Figure 4:
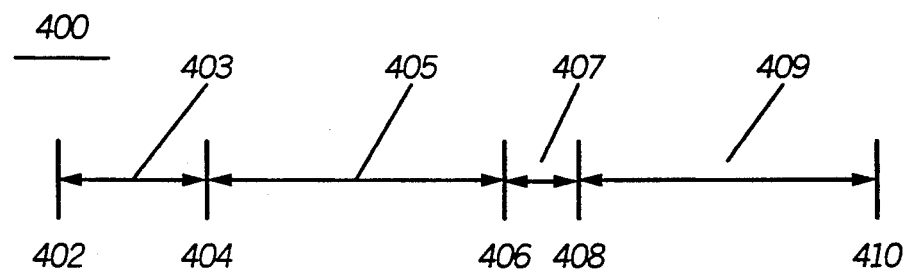
FIG. 4 is a timing diagram of a TDM communication system.

Referring now to FIG. 4, a timing diagram of the operation of the communication device 508 is shown. This timing diagram includes the start of events along with the duration of events. The request of a user to start a transmission is denoted by 402. In other words, 402 is the moment that the synthesizer receives command to search and go to a new channel. The period 403 is the settling time of the PLL 100. During the settling time of the synthesizer, the wide filter 110 is engaged and the storage elements, the capacitor 222 and 218 of the narrow filter 108 are being pre-charged. The duration of this time is denoted by 403. At the start of 404, the communication device 508 is ready to receive information. The communication device 508 receives information during the period 405 where it is also decoding the data to identify its poll. At 406, the poll has been positively identified and the communication device 508 starts processing the received information. The processing time of the communication device 508 has been denoted by 407. Upon completion of 407 denoted by 408, the phase locked loop 100 switches to the narrow loop filter 108. During period 409, the communication device 508 starts the transmission of the requested signal in accordance with the TDM protocol.

For a better understanding of the system under discussion, some of the specific timing of the timing diagram 400 are presented here. It is however understood that other timings may by used to provide similar results for other applications. The duration 403 is equal to 1 millisecond which indicates the settling time of the synthesizer within the PLL 100. It can be seen that the significant benefit of the wide loop filter 110 is to provide the PLL 100 with a filter having a very fast acquisition time. The duration 405 is equal to 5 millisecond. The time period indicated by the difference in time from 402 to 408 is equal to about 6 ½ milliseconds. This is the period that the narrow loop filter 108 requires to charge up and get engaged in the phase locked loop circuit. It can be seen that with the benefit of the short acquisition time of the wide loop filter 110, channel scanning at high rates can be accomplished. Problems associated with the performance degradations afforded by the wide loop filter 110 are minimized by the use of the narrow filter 108 that is engaged, having been pre-charged, after a channel has been locked on. The narrow loop filter 108 is switched into the loop after the scanning has been completed and the transmission and the reception of information has commenced.

In summary, it has been demonstrated that by use of the phase locked loop 100 having two filters, one with narrow loop characteristics 108 and one with wide loop characteristics 110, a communication device having a high scanning rate can operate in a TDM system. While the wide loop filter 110 is being used to scan the available channels in the transmit mode, the narrow loop filter 108 is being charged up to provide a reference signal having an accurate frequency once such frequency has been determined via the scanning of the available channels. With the use of the PLL 100 which employs two filters 110, and 108, it is possible to scan a number of channels in a short period of time. The overriding factor in scan time is no longer the performance characteristics of the loop filter. The need for sacrifice between speed and loop performance is therefore greatly reduced. In the receive mode, the preamble of a received information signal is evaluated with the wide loop filter 110 while the storage elements 218 and 222 of the narrow loop filter 108 are being charged. Soon as the signal is determined to be intended for this receiver, the two filters 110 and 108 are switched providing the PLL 100 with the full advantages of the narrow loop characteristics of the filter 108 without the necessary slow charge up speed. With this scheme the switch over is virtually transientless since no drop in the voltage of the control signal 103 of the VCO 104 occurs. A significant advantage of this invention is that with the wide loop filter 110, the communication device 508 can receive, decode, and process a digital information signal without affecting its sensitivity. During this period, the narrow loop filter 108 is pre-charged ready to be engaged upon command. Note that narrow loop characteristics are required to keep the transmitter spurs generated by the reference within specification.

Another significant benefit of the fast lock PLL of the present invention is the battery saving feature that it offers to a receiver. The fast speed of the PLL allows the radio to remain in the sleep mode, with much lower battery consumption, for a longer period of time. This benefit can particularly be appreciated in portable communication devices with battery size constraints.

Those skilled in the art appreciate the use of other phase locked loop circuits to achieve similar results. Indeed, circuits using frequency locked loops are suitable for operation in the communication device 508. The communication system 500 and its elements are presented here to provide the preferred embodiment of the invention. However, they should not be construed as limitations. Nor shall they be held as the only possible means of putting the present invention to work. Changes are possible without significant departure form the spirit of the invention as claimed.

What is claimed is:

1. A transceiver for use in a time division multiplex communication system having at least one control station, a plurality of radios, and a plurality of radio frequency communication channels apportioned in at least two time slots for communicating information signals at a pre-determined rate, the transceiver comprising:
   scanning means coupled to the receiver means for selectively and substantially quickly scanning the radio frequency communication channels to determine an available communication channel;
   transmitter means for transmitting information signals using the available communication channel;
   receiver means for receiving information signals using the available communication channel;
   phase lock loop (PLL) means for locking to the available channel and for providing a reference signal for the transceiver, the PLL including:
   a voltage controlled oscillator (VCO) having a control signal input;
   first filter means having an output and a wide frequency response for providing the scanning means with the filter means to quickly scan the communication channels;
   second filter means having an output, a storage element, and a narrow frequency response for providing the PLL with the filter means to lock to the available channel with minimum level of interfering noise;

switching means having an output coupled to the control signal input of the VCO, a first input coupled to the output of the first filter, a second input coupled to the output of the second filter, and a charging output coupled to the storage element of the second filter means, the switching means for coupling the output of the first filter to the control signal input of the VCO for a predetermined period of time while pre-charging the storage element of the second filter, then upon the completion of the predetermined period of time, coupling the output of the second filter to the control signal input of the VCO.

2. The transceiver of claim 1, wherein the transmitter means and the receiver means operate on the same frequency.

3. The transceiver of claim 1, wherein the storage element comprises a capacitor.

4. The transceiver of claim 1, wherein the switching means includes a plurality of switches.

5. The transceiver of claim 1, wherein the switching means includes an analog gate.

6. A phase lock loop (PLL) for use in a communication device operating on a plurality of channels, the PLL comprising:

a voltage controlled oscillator (VCO) having a control signal input;

first filter means coupled to the VCO having an output and a wide frequency response;

second filter means coupled to the VCO having an output, a storage element, and a narrow frequency response for providing the PLL with the filter means to lock to one of the plurality of channels;

switching means having an output coupled to the control signal input of the VCO, a first input coupled to the output of the first filter, a second input coupled to the output of the second filter, and a charging output coupled to the storage element of the second filter means, the switching means for coupling the output of the first filter to the control signal input of the VCO for a predetermined period of time while pre-charging the storage element of the second filter, then upon the completion of the predetermined period of time, coupling the output of the second filter to the control signal input of the VCO.

7. The PLL of claim 6, wherein the storage element comprises a capacitor.

8. The PLL of claim 6, wherein the switching means includes a plurality of switches.

9. The PLL of claim 6, wherein the switching means includes an analog gate.

* * * * *